United States Patent
Chae et al.

(10) Patent No.: US 9,974,183 B2
(45) Date of Patent: May 15, 2018

(54) MULTILAYER CERAMIC ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Eun Hyuk Chae, Suwon-si (KR); Hyun Hee Gu, Suwon-si (KR); Jong Ho Lee, Suwon-si (KR); Jae Yeol Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/401,568

(22) Filed: Jan. 9, 2017

(65) Prior Publication Data
US 2017/0367187 A1 Dec. 21, 2017

(30) Foreign Application Priority Data
Jun. 21, 2016 (KR) ........................ 10-2016-0077313

(51) Int. Cl.
*H05K 1/16* (2006.01)
*H05K 1/18* (2006.01)
(Continued)

(52) U.S. Cl.
CPC ............. *H05K 1/181* (2013.01); *H01G 4/012* (2013.01); *H01G 4/12* (2013.01); *H01G 4/248* (2013.01);
(Continued)

(58) Field of Classification Search
CPC .. H05K 1/02; H05K 1/18; H05K 7/00; H01G 4/01; H01G 4/12; H01G 4/30; H01G 4/38
(Continued)

(56) References Cited

U.S. PATENT DOCUMENTS 6,134,098 A * 10/2000 Kuroda ................... H01G 4/30
29/25.42
9,734,950 B2 * 8/2017 Sasaki ..................... H01G 4/30
(Continued)

FOREIGN PATENT DOCUMENTS

JP 2005-012167 A 1/2005
JP 2012-248581 A 12/2012
(Continued)

OTHER PUBLICATIONS

Korean Office Action dated May 12, 2017, issued in Korean Patent Application No. 10-2016-0077313. (w/ English translation).

*Primary Examiner* — Xiaoliang Chen
(74) *Attorney, Agent, or Firm* — McDermott Will & Emery LLP

(57) ABSTRACT

A multilayer ceramic electronic component includes: a ceramic body including: an active part with dielectric layers interposed with a plurality of first and second internal electrodes; an upper cover part above the active part; a lower cover part below the active part and having a thickness greater than that of the upper cover part; and first and second external electrodes electrically connected to the first and second internal electrodes, respectively, wherein the first and second external electrodes are disposed on respective end surfaces of the ceramic body in a length direction and on a lower surface of the ceramic body in a thickness direction and are not disposed on an upper surface of the ceramic body in the thickness direction.

11 Claims, 7 Drawing Sheets

(51) Int. Cl.
  *H01G 4/012* (2006.01)
  *H01G 4/12* (2006.01)
  *H01G 4/248* (2006.01)
  *H01G 4/30* (2006.01)
  *H05K 1/11* (2006.01)
  *H05K 3/34* (2006.01)

(52) U.S. Cl.
  CPC ............... *H01G 4/30* (2013.01); *H05K 1/111* (2013.01); *H05K 3/3442* (2013.01); *H05K 2201/10015* (2013.01); *H05K 2201/10636* (2013.01)

(58) Field of Classification Search
  USPC ........... 174/260, 258; 361/301.4, 303, 321.2, 361/321.4
  See application file for complete search history.

(56) References Cited

U.S. PATENT DOCUMENTS

| | | | |
|---|---|---|---|
| 2004/0240146 A1 | 12/2004 | Kayatani et al. | |
| 2007/0215379 A1 | 9/2007 | Komatsu et al. | |
| 2012/0274432 A1* | 11/2012 | Jeong | H01F 27/2804 336/192 |
| 2012/0300361 A1* | 11/2012 | Togashi | H01G 4/30 361/301.4 |
| 2013/0319741 A1* | 12/2013 | Ahn | H01G 4/30 174/260 |
| 2013/0321981 A1* | 12/2013 | Ahn | H01G 4/30 361/321.2 |
| 2014/0020942 A1* | 1/2014 | Cho | H01G 4/30 174/260 |
| 2014/0083755 A1* | 3/2014 | Lee | H05K 1/181 174/260 |
| 2014/0116766 A1* | 5/2014 | Jeon | H05K 3/3442 174/260 |
| 2014/0131082 A1* | 5/2014 | Ahn | H05K 3/3442 174/260 |
| 2014/0133064 A1* | 5/2014 | Ahn | H01G 4/30 361/303 |
| 2014/0174806 A1* | 6/2014 | Park | H01G 4/12 174/260 |
| 2014/0177128 A1* | 6/2014 | Kim | H01G 4/12 361/301.4 |
| 2014/0209362 A1* | 7/2014 | Park | H01G 2/065 174/260 |
| 2015/0043125 A1* | 2/2015 | Park | H01G 4/12 361/301.4 |
| 2015/0279569 A1* | 10/2015 | Ahn | H01G 4/30 174/260 |
| 2015/0287533 A1* | 10/2015 | Lee | H01G 4/30 174/260 |
| 2015/0318113 A1* | 11/2015 | Kim | H01G 4/232 174/260 |
| 2016/0020024 A1* | 1/2016 | Shin | H01G 9/052 174/260 |
| 2016/0020031 A1* | 1/2016 | Shin | H01G 4/38 174/260 |
| 2016/0020032 A1* | 1/2016 | Shin | H01G 4/38 174/260 |
| 2016/0027593 A1* | 1/2016 | Ahn | H01G 4/38 361/301.4 |
| 2016/0086730 A1* | 3/2016 | Park | H01G 4/30 174/260 |
| 2016/0189868 A1* | 6/2016 | Sasaki | H01G 4/30 361/301.4 |
| 2016/0212843 A1* | 7/2016 | Park | H05K 1/181 |
| 2017/0018373 A1* | 1/2017 | Son | H05K 1/181 |

FOREIGN PATENT DOCUMENTS

| | | |
|---|---|---|
| KR | 10-2007-0089629 A | 8/2007 |
| KR | 10-2012-0122589 A | 11/2012 |
| KR | 10-2015-0018650 A | 2/2015 |
| KR | 10-2015-0115184 A | 10/2015 |

* cited by examiner

MULTILAYER CERAMIC ELECTRONIC COMPONENT AND BOARD HAVING THE SAME

CROSS-REFERENCE TO RELATED APPLICATION(S)

This application claims benefit of priority to Korean Patent Application No. 10-2016-0077313 filed on Jun. 21, 2016 in the Korean Intellectual Property Office, the disclosure of which is incorporated herein by reference in its entirety.

BACKGROUND

1. Field

The present disclosure relates to a multilayer ceramic electronic component and a board having the same.

2. Description of Related Art

In accordance with a recent trend toward miniaturization of electronic products, multilayer ceramic electronic components used in these electronic products have been required to have a small size and high capacitance.

Therefore, various methods for decreasing thicknesses of dielectric layers and internal electrodes and increasing the number of dielectric layers and internal electrodes have been attempted, and a multilayer ceramic electronic component in which thicknesses of dielectric layers are decreased and the number of stacked dielectric layers is increased has recently been manufactured.

Since the dielectric layers have a piezoelectric property and an electrostrictive property, a piezoelectric phenomenon occurs between the internal electrodes when direct current (DC) or alternating current (AC) voltages are applied to the multilayer ceramic electronic component, which may cause vibrations.

These vibrations are transferred to a printed circuit board, on which the multilayer ceramic electronic component is mounted, through external electrodes of the multilayer ceramic electronic component and solder, such that the entirety of the printed circuit board becomes a sound reflecting surface to generate a vibrational sound, which constitutes noise.

The vibration sound may correspond to an audio frequency range of 20 to 20,000 Hz, making people uncomfortable when they hear these sounds. The vibrational sound making the people uncomfortable, as described above, is called acoustic noise.

Recently, due to a decrease in noise of other components of an electronic device, the acoustic noise generated in the multilayer ceramic electronic component may be more prominent to people using the device. Therefore, technology capable of effectively reducing the acoustic noise generated in the multilayer ceramic electronic component has been researched.

Korean Patent Laid-Open Publication No. 10-2007-0089629 discloses a multilayer ceramic capacitor, but does not disclose a structure in which a lower cover part is formed at a thickness greater than that of an upper cover part, and a structure in which external electrodes include insulating layers in order to reduce the acoustic noise.

SUMMARY

An aspect of the present disclosure may provide a multilayer ceramic electronic component and a board having the same.

According to an aspect of the present disclosure, a multilayer ceramic electronic component may include: a ceramic body including: an active part including a plurality of first and second internal electrodes disposed in the ceramic body and alternately exposed to respective end surfaces of the ceramic body, with dielectric layers interposed therebetween; an upper cover part formed above the active part; a lower cover part formed below the active part and having a thickness greater than that of the upper cover part; and first and second external electrodes electrically connected to the first and second internal electrodes, respectively, wherein the first and second external electrodes are disposed on both end surfaces of the ceramic body in a length direction and on a lower surface of the ceramic body in a thickness direction and are not disposed on an upper surface of the ceramic body.

According to another aspect of the present disclosure, a board having a multilayer ceramic electronic component may include: a printed circuit board having electrode pads disposed thereon; the multilayer ceramic electronic component, as described above, on the electrode pads; and solder connecting the electrode pads to the multilayer ceramic electronic component, wherein the solder is disposed on a lower surface of the ceramic body in a thickness direction and end surfaces of the ceramic body in a length direction.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Hereinafter, exemplary embodiments of the present disclosure will be described in detail with reference to the accompanying drawings.

A multilayer ceramic electronic component according to an exemplary embodiment in the present disclosure, particularly, a multilayer ceramic capacitor, will be described. However, the present disclosure is not limited thereto.

Multilayer Ceramic Capacitor

Figure 1:
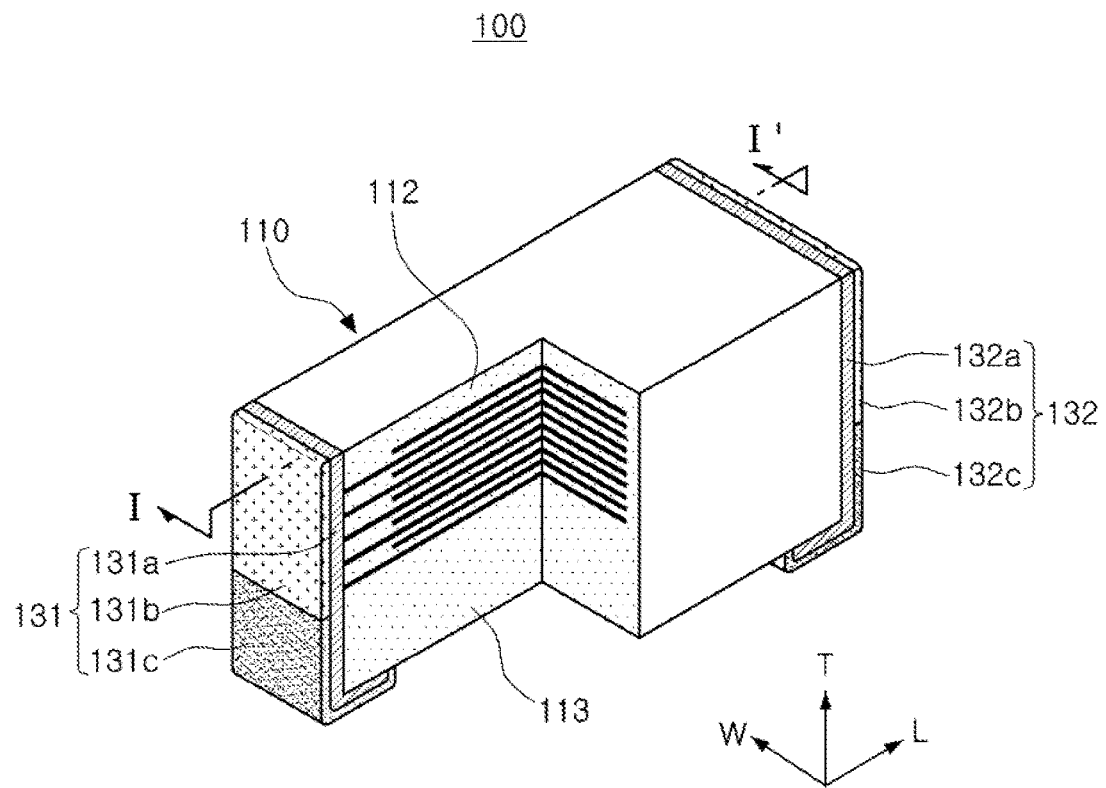
FIG. 1 is a partially cut-away perspective view schematically illustrating a multilayer ceramic capacitor according to an exemplary embodiment in the present disclosure.
Figure 2:
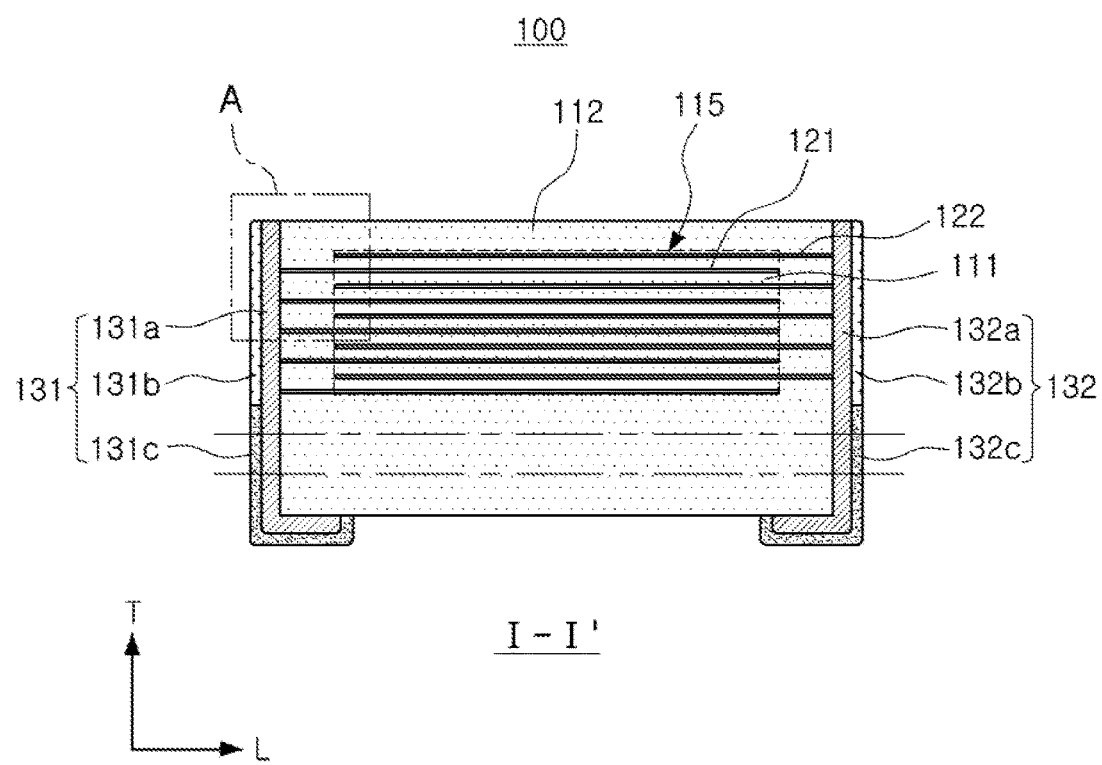
FIG. 2 is a cross-sectional view taken along line I-I' of FIG. 1.

FIG. 1 is a partially cut-away perspective view schematically illustrating a multilayer ceramic capacitor according to an exemplary embodiment in the present disclosure, and FIG. 2 is a cross-sectional view taken along line I-I' of FIG. 1.

Referring to FIGS. 1 and 2, a multilayer ceramic capacitor 100 according to the present exemplary embodiment may include a ceramic body 110, an active part 115 including a plurality of first and second internal electrodes 121 and 122, upper and lower cover parts 112 and 113, and first and second external electrodes 131 and 132 electrically connected to the first and second internal electrodes 121 and 122, respectively.

The ceramic body 110 may be formed by stacking and then sintering a plurality of dielectric layers 111. The shape and dimensions of the ceramic body 110, and the number of dielectric layers 111 stacked in the ceramic body 110, are not limited to those illustrated in the present exemplary embodiment.

The plurality of dielectric layers 111 forming the ceramic body 110 may be in a sintered state. Adjacent dielectric layers 111 may be integrated with each other so that boundaries therebetween are not readily apparent without using a scanning electron microscope (SEM).

The ceramic body 110 may have a hexahedral shape. Terms used in this application with respect to directions of a hexahedron will be defined in order to clearly describe exemplary embodiments in the present disclosure. For instance, L, W, and T illustrated in FIG. 1 refer to a length direction, a width direction, and a thickness direction, respectively.

In the present exemplary embodiment, an upper surface and a lower surface refer to both surfaces opposing each other in a stacked direction of the dielectric layers 111 of the ceramic body 110 (that is, a thickness direction of the ceramic body 110). First and second end surfaces refer to both surfaces connecting the upper surface and the lower surface to each other and opposing each other in a length direction. First and second side surfaces refer to both surfaces opposing each other in a width direction.

The ceramic body 110 may include the active layer 115, contributing to forming capacitance of a capacitor, and the upper and lower cover layers 112 and 113, formed as upper and lower margin parts on upper and lower surfaces of the active part 115, respectively.

The active part 115 may be formed by repeatedly stacking the plurality of first and second internal electrodes 121 and 122 to be alternately exposed through respective end surfaces of the ceramic body 110, with dielectric layers 111 interposed therebetween.

A thickness of the dielectric layer 111 may be arbitrarily changed in accordance with a capacitance design of the multilayer ceramic capacitor 100. Preferably, a thickness of one dielectric layer 111 may be 0.01 to 1.00 µm after the dielectric layer 111 is sintered, but is not limited thereto.

The dielectric layer 111 may include a ceramic material having a high dielectric constant, such as barium titanate ($BaTiO_3$)-based ceramic powders, strontium titanate ($SrTiO_3$)-based ceramic powders, or the like. However, a material of the dielectric layer 111 is not limited thereto, as long as sufficient capacitance may be obtained.

The dielectric layer 111 may further include various kinds of ceramic additives such as a transition metal oxide or carbide, rare earth elements, magnesium (Mg), aluminum (Al), or the like, and organic solvents, plasticizers, binders, dispersants, and the like, if necessary, in addition to the ceramic powders.

The upper and lower cover parts 112 and 113 may be formed of the same material as that of the dielectric layer 111 and have the same configuration as that of the dielectric layers 111, except that they do not include internal electrodes.

The upper and lower cover parts 112 and 113 may be formed by stacking one or more dielectric layers on each of the upper and lower surfaces of the active part 115, respectively. The upper and lower cover parts 112 and 113 may basically serve to prevent damage to the first and second internal electrodes 121 and 122 due to physical or chemical stress.

The number of dielectric layers stacked in the lower cover part 113 may be larger than the number of dielectric layers stacked in the upper cover part 112, such that the lower cover part 113 may be formed to have a thickness greater than that of the upper cover part 112.

The first and second internal electrodes 121 and 122, which are electrodes having different polarities, may be formed in a stacked direction of the dielectric layers 111 to be alternately exposed through first and second end surfaces of the ceramic body 110, respectively, by printing a conductive paste including a conductive metal at a predetermined thickness on the dielectric layers 111. The first and second internal electrodes 121 and 122 may be electrically insulated from each other by dielectric layers 111 disposed therebetween.

The conductive metal may be one of, for example, silver (Ag), palladium (Pd), platinum (Pt), nickel (Ni), and copper (Cu), or alloys thereof. However, the conductive metal according to the present disclosure is not limited thereto. A method of printing the conductive paste may be a screen printing method, a gravure printing method, or the like. However, the method of printing the conductive paste according to the present disclosure is not limited thereto.

The first and second internal electrodes 121 and 122 may be electrically connected to first and second external electrodes 131 and 132, respectively, through portions alternately exposed through first and second end surfaces of the ceramic body 110 in the length direction of the ceramic body 110.

When voltages are applied to the first and second external electrodes 131 and 132, electric charges may accumulate between the first and second internal electrodes 121 and 122 facing each other. Capacitance of the multilayer ceramic capacitor 100 may be in proportion to an area of a region in which the first and second internal electrodes 121 and 122 overlap each other.

Thicknesses of the first and second internal electrodes 121 and 122 may be determined based on an intended use of the multilayer ceramic capacitor. For example, the thicknesses of the first and second internal electrodes 121 and 122 may be determined to be in a range of 0.2 to 1.0 µm, in consideration of a size of the ceramic body 110. However, the thicknesses of the first and second internal electrodes 121 and 122 according to the present disclosure are not limited thereto.

The first and second external electrodes 131 and 132 may include first and second electrode layers 131a and 132a, respectively.

The first and second electrode layers 131a and 132a may be disposed on respective end surfaces of the ceramic body 110 in the length direction and on the lower surface of the ceramic body in the thickness direction so as to cover and be electrically connected to the plurality of first and second internal electrodes 121 and 122 alternately exposed through the first and second end surfaces of the ceramic body 110 in the length direction.

The first and second electrode layers 131a and 132a may be formed of, for example, a copper (Cu)-glass paste, in order to have excellent electrical characteristics and provide high reliability such as excellent humidity resistance or the like. However, the first and second electrode layers 131a and 132a according to the present disclosure are not limited thereto.

According to the exemplary embodiment, the first and second electrode layers 131a and 132a may be disposed from both end surfaces of the ceramic body 110 in the length direction of the ceramic body 110 up to corresponding corner portions of the ceramic body 110.

The first and second electrode layers 131a and 132a may be disposed on both end surfaces of the ceramic body 110 in the length direction, respectively, and the lower surface of the ceramic body 110, but may be not disposed on the upper surface of the ceramic body 110 in the thickness direction.

The first and second electrode layers 131a and 132a may also be extended to the two side surfaces of the ceramic body 110 in the width direction.

The first and second electrode layers 131a and 132a may have portions extended on the two side surfaces of the ceramic body 110 in the width direction.

Forming an external electrode according to the related art principally involves dipping a ceramic body in a paste including a metal component.

When the external electrode is formed by the dipping method, the paste for the external electrode is not uniformly applied, due to fluidity and viscosity of the paste. This generates a difference in thickness between a central portion and a corner portion of the external electrode in which the paste is applied.

When the thickness of the external electrode is not uniform, as described above, glass beading or blister is generated in the central portion in which the applied paste is thick and causes a plating defect and a shape defect. In addition, a corner portion in which the applied paste is thin is vulnerable to permeation of a plating solution, such that reliability is deteriorated.

Increasing the paste thickness to prevent the corner portion from being vulnerable to the plating solution leads to an increased thickness at the central portion, which limits the ability to increase the size of the ceramic capacitor to increase capacitance.

When the first and second electrode layers 131a and 132a are not formed by the dipping method, the first and second electrode layers 131a and 132a may be formed on respective end surfaces of the ceramic body 110 in the length direction L, and may be not formed at all, or only minimally formed, on surfaces other than the lower surface of the ceramic body 110 in the thickness direction, which corresponds to the mounting surface for mounting on a printed circuit board. The external electrodes may preferably be formed at thin and uniform thicknesses.

Thin external electrodes allows formation areas of the internal electrodes to be increased, such that areas in which the internal electrodes overlap each other may be significantly increased, and a high capacitance multilayer ceramic capacitor may be implemented.

According to the exemplary embodiment, the first and second electrode layers 131a and 132a may be formed by a sheet transfer method or a pad transfer method, rather than the dipping method according to the related art.

Referring to FIGS. 1 and 2, it may be appreciated that the first and second electrode layers 131a and 132a are disposed on the end surfaces of the ceramic body 110 in the length direction, extend up to upper corner portions of the end surfaces, extend on the lower surface of the ceramic body 110 in the thickness direction, and are not formed at all on the remaining three surfaces.

The first and second electrode layers 131a and 132a may be formed by transferring sheets including a conductive metal.

According to the exemplary embodiment, the external electrodes may have an L shape, such that a markings or different coloring used for distinguishing the upper and lower surfaces from each other is not required. It is thus possible to avoid the deterioration of reliability such as a crack or the like, that may occur, for example, from a method of coloring the upper and lower surfaces of the ceramic body different colors.

The external electrodes 131 and 132 may be disposed on both end surfaces of the ceramic body 110 in the length direction and on the lower surface of the ceramic body 110 in the thickness direction, but may be not disposed on the upper surface of the ceramic body 110 in the thickness direction, so that otherwise distinguishing the upper and lower surfaces from each other is not required. As a result, the risks from creating distinguishing marks or colors may be avoided.

Since the external electrodes are formed on only the end surfaces of the ceramic body 110 in the length direction of the ceramic body 110 and on the lower surface corresponding to the mounted surface, while having the L shape, a structure where solder 230 goes up along only one surface of the ceramic body may be implemented to reduce acoustic noise.

Figure 3:
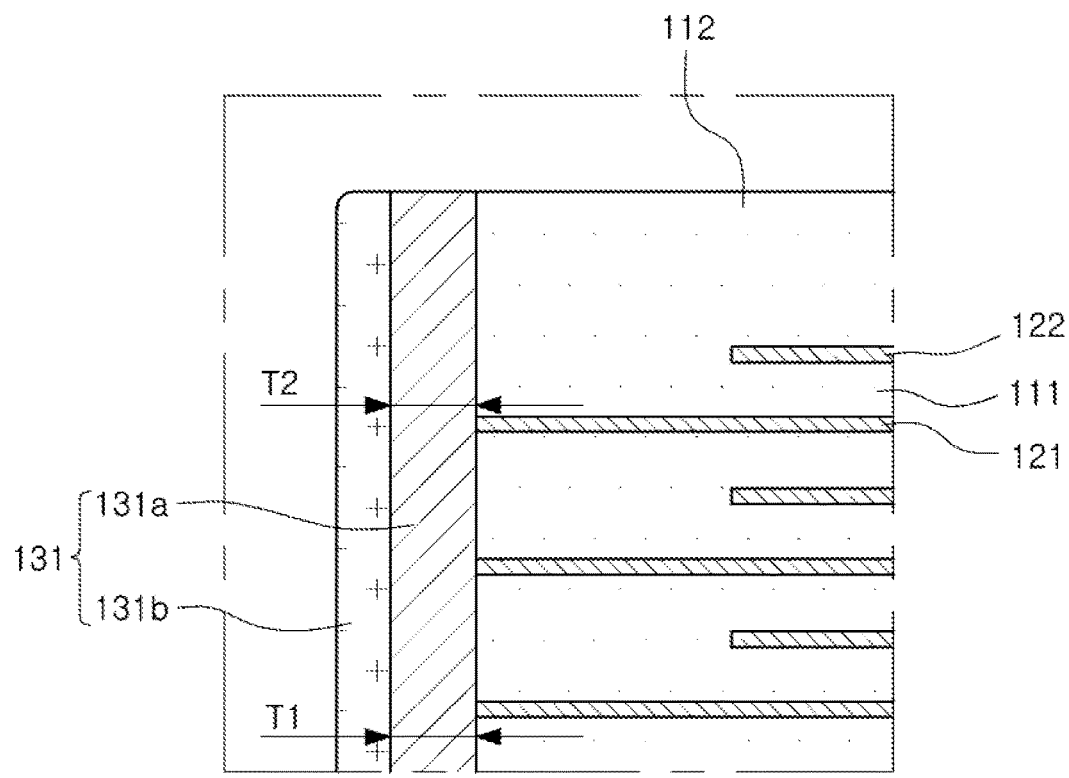
FIG. 3 is an enlarged view of region 'A' of FIG. 2.

FIG. 3 is an enlarged view of region 'A' of FIG. 2.

Referring to FIG. 3, when a thickness of the first and second electrode layers 131a and 132a in a central region of the ceramic body 110 in the thickness direction is T1, and a thickness of the first and second electrode layers 131a and 132a, at a point at which an uppermost internal electrode in the thickness direction among the first and second internal electrodes 121 and 122 is positioned is T2, $0.8 \leq T2/T1 \leq 1.2$.

The thickness T1 refers to the length that a virtual line drawn from a central point of the ceramic body 110 in the thickness direction and traveling in the length direction overlaps the external electrode.

The thickness T2 refers to the length that a virtual line drawn from a position of an uppermost internal electrode in the thickness direction and traveling in the length direction overlaps the external electrode.

The ratio of thicknesses T2 and T1 can satisfy the range $0.8 \leq T2/T1 \leq 1.2$ reduces a deviation between the thickness T1 of each of the first and second electrode layers 131a and 132a in the central region of the ceramic body 110, in the thickness direction of the ceramic body 110, and the thickness T2 of each of the first and second electrode layers 131a and 132a, at the point at which the uppermost internal electrode is positioned, whereby deterioration of reliability may be prevented.

Where T2/T1 is less than 0.8 or exceeds 1.2, a deviation between thicknesses of the external electrodes is large, such that a plating solution may permeate into a thin portion of the external electrode, thereby deteriorating reliability.

According to the exemplary embodiment, insulating layers 131b and 132b may be additionally be disposed on the first and second electrode layers 131a and 132a, respectively. The insulating layers 131b and 132b may be disposed from upper corner portions of the ceramic body 110 in the thickness direction down to a region horizontally corresponding to the lower cover part 113. Furthermore, where the lower cover part 113 is trisected in the thickness direction into three equal portions, the insulating layers 131b and 132b may preferably be disposed down to a region horizontally corresponding to the uppermost of the three portions of the lower cover part 113.

The insulating layers 131b and 132b may be disposed on the first and second electrode layers 131a and 132a, respectively, or may be disposed on the first and second end surfaces of the ceramic body 110 in the length direction, respectively. The insulating layers 131b and 132b may prevent or significantly reduce solder 230 on portions, except for mounting surfaces, of the first and second external electrodes 131 and 132.

The insulating layers 131b and 132b may be disposed from positions horizontally corresponding to the upper corner portions of the ceramic body 110 in the thickness direction down to the region of horizontally corresponding to the lower cover part 113, preferably horizontally corresponding to the upper third portion of the lower cover part 113, so that the solder 230 is not formed on the external electrode in regions horizontally corresponding to the internal electrodes.

The insulating layers 131b and 132b may be disposed to lower the height of the solder 230 on the external electrodes. This may suppress vibrations generated in the multilayer ceramic capacitor from being transferred to the printed circuit board through the external electrodes and the solder, thereby reducing acoustic noise.

When the insulating layers 131b and 132b are formed on the entirety of the portions of the respective external electrodes on the end surfaces of the ceramic body 110 in the length direction, formation areas of the solder 230 may be reduced, such that a mounting defect due to impact at the time of mounting the multilayer ceramic capacitor on the printed circuit board may occur.

That is, the insulating layers 131a and 132 may be disposed down to a region horizontally corresponding to the lower cover part 113, preferably horizontally corresponding to the upper third portion of the lower cover part 113, to not only reduce acoustic noise, but also to reduce the risk of mounting defects.

The first and second external electrodes 131 and 132 may further include first and second plating layers 131c and 132c disposed on the first and second electrode layers 131a and 132a and disposed to cover lower surfaces of the first and second electrode layers 131a and 132a and end portions of the insulating layers 131b and 132b, respectively.

The first and second plating layers 131c and 132c may include nickel (Ni) plating layers, disposed to cover the lower surfaces of the first and second electrode layers 131a and 132a and the end portions of the insulating layers 131b and 132b, and tin (Sn) plating layers formed on the nickel plating layers.

The first and second plating layers 131c and 132c may increase adhesion strength between the multilayer ceramic capacitor 100 and the printed circuit board at the time of mounting or the like, using the solder. Plating for forming the first and second plating layers may be performed by a known method. As an example, lead-free plating may be performed in consideration of an environmentally friendly factor. However, the plating according to the present disclosure is not limited thereto.

A relationship between the dimensions of components included in the multilayer ceramic capacitor according to the present exemplary embodiment and acoustic noise will hereinafter be described.

Figure 4:
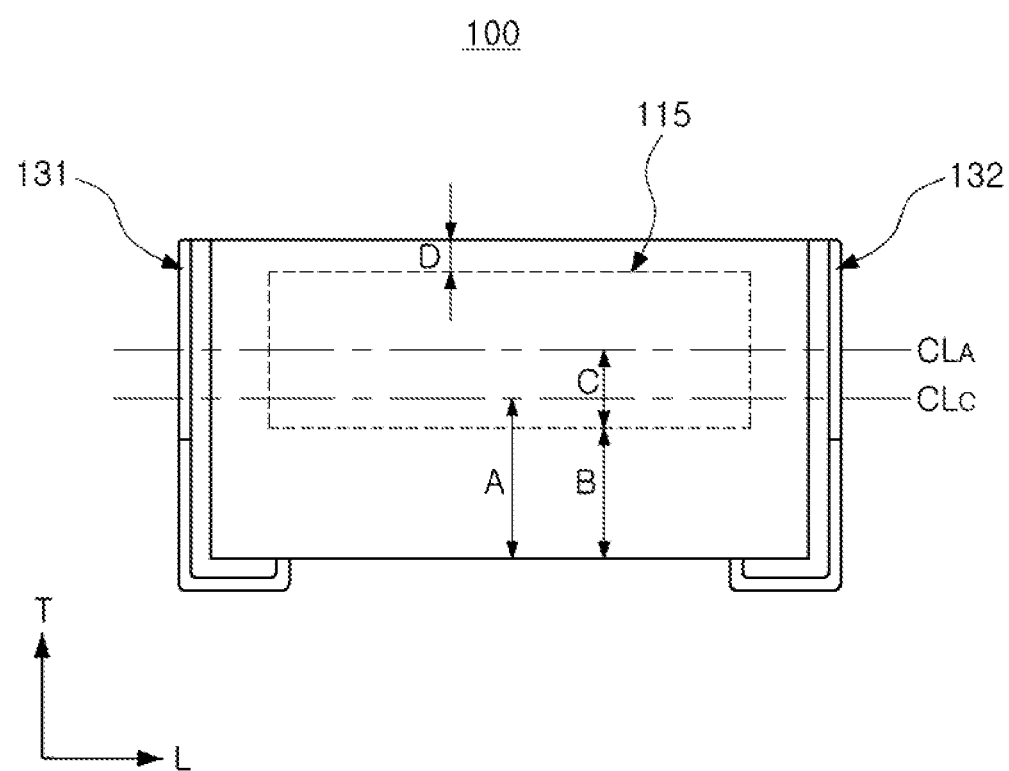
FIG. 4 is a schematic cross-sectional view of the multilayer ceramic capacitor of FIG. 1 cut in a length direction in order to describe a dimensional relationship among components in the multilayer ceramic capacitor.

FIG. 4 is a schematic cross-sectional view of the multilayer ceramic capacitor of FIG. 1 cut in a length direction in order to describe a dimensional relationship among components included in the multilayer ceramic capacitor according to the present exemplary embodiment.

Referring to FIG. 4, "A" refers to one-half of a thickness of the ceramic body 110, "B" refers to a thickness of the lower cover part 113, "C" refers to one-half of a thickness of the active part 115, and "D" refers to a thickness of the upper cover part 112.

The thickness of the ceramic body 110 refers to a distance from the upper surface of the ceramic body 110 to the lower surface of the ceramic body 110. The thickness of the active part 115 refers to a distance from an upper surface of the uppermost internal electrode to a lower surface of the lowermost internal electrode.

The thickness B of the lower cover part 113 refers to a distance from the lower surface of the lowermost internal electrode to the lower surface of the ceramic body 110. The thickness D of the upper cover part 112 refers to a distance from the upper surface of the uppermost internal electrode to the upper surface of the ceramic body 110.

When voltages having different polarities are respectively applied to the first and second external electrodes 131 and 132 respectively disposed on the first and second end surfaces of the ceramic body 110 in the length direction, the ceramic body 110 may expand and contract in the thickness direction due to an inverse piezoelectric effect of the dielectric layers 111. In addition, both end surfaces of the ceramic body 110 in the length direction may contract and expand, in opposition to the expansion and contraction of the ceramic body 110 in the thickness direction due to a Poisson effect.

A central portion of the active part 115 may be a portion in which large contraction and expansion are generated on both end surfaces of the ceramic body 110 in the length direction on which the first and second external electrodes 131 and 132 are formed. When solder 230 is bonded to this portion, most contraction and expansion behavior of the end surfaces of the ceramic body 110 in the length direction may be transferred to the printed circuit board through the solder, which may generate a large amount of acoustic noise.

In the present exemplary embodiment, the solder 230 may be formed up to or below a position horizontally corresponding to the lowermost internal electrode. Furthermore, the lower cover part 113 may have a thickness greater than that of the upper cover part 112.

Therefore, inflection points formed on the end surfaces of the ceramic body 110 in the length direction, due to a difference between a deformation rate generated in a central portion $CL_A$ of the active part 115 and a deformation rate generated in the lower cover part 113 by voltages applied to the external electrodes, may be equal to or lower than a central portion $CL_C$ of the ceramic body 110 in the thickness direction of the ceramic body 110, to reduce acoustic noise.

In order to further reduce the acoustic noise, the dimensions can satisfy the relationship $1.050 \leq (B+C)/A \leq 1.764$, in which $(B+C)/A$ is a ratio in which the central portion $CL_A$ of the active part 115 in the thickness direction is above the central portion $CL_C$ of the ceramic body 110 in the thickness direction.

In addition, the dimensions can satisfy the relationship $0.021 \leq D/B \leq 0.545$, in which D/B is a ratio of the thickness of the upper cover part 112, D, to the thickness of the lower cover part 113, B.

Further, the dimensions can satisfy the relationship $0.331 \leq B/A \leq 1.537$, in which B/A is a ratio of the thickness of the lower cover part 113, B, to one-half of the thickness of the ceramic body 110, A.

Further, the dimensions can satisfy the relationship $0.148 \leq C/B \leq 2.441$, in which C/B is a ratio of one-half of the thickness of the active part 115, C, to the thickness of the lower cover part 113, B.

Experimental Example

Multilayer ceramic capacitors according to Inventive Examples and Comparative Examples have been manufactured as described below.

A slurry formed by mixing powders such as barium titanate ($BaTiO_3$)-based powders or the like, a polymer, a solvent and the like, with each other was applied to carrier films and was dried by a doctor blade method or the like, to prepare a plurality of ceramic green sheets having a thickness of several micrometers.

The purpose of the ceramic green sheets is to form the dielectric layers 111 of the ceramic body 110.

A conductive paste for internal electrodes was applied at a predetermined thickness onto the ceramic green sheets to form the first and second internal electrodes 121 and 122, each exposed through respective end surfaces of the ceramic green sheets in the length direction.

The conductive paste may be applied with a screen printing method, a gravure printing method, or the like, but is not limited thereto.

The plurality of ceramic green sheets were stacked so that a plurality of first and second internal electrodes 121 and 122 were disposed to face each other, with the ceramic green sheets interposed therebetween, thereby forming a laminate.

Ceramic green sheets on which the first and second internal electrodes 121 and 122 were not formed could be stacked in a larger amount below the ceramic green sheets on which the first and second internal electrodes 121 and 122 were formed than above the ceramic green sheets on which the first and second internal electrodes 121 and 122 were formed.

The formed laminate was isostatically pressed under a pressure condition of approximately 1,000 $kgf/cm^{2'}$ at a temperature of approximately 85° C.

The pressed laminate was cut, with regions thereof corresponding to individual capacitors. The individual capacitors were maintained in an air atmosphere at a temperature of approximately 230° C. for approximately sixty hours while being subjected to a binder removal process.

The chips were sintered at a temperature of approximately 1,200° C. in a reduction atmosphere, under oxygen partial pressure of $10^{-11}$ to $10^{-10}$ atm lower than a Ni/NiO equilibrium oxygen partial pressure, in order to avoid oxidation of the first and second internal electrodes 121 and 122, thereby preparing the ceramic body 110.

The first and second external electrodes 131 and 132 were formed on respective end surfaces of the ceramic body 110, so as to be electrically connected to the exposed portions of the first and second internal electrodes 121 and 122.

A method of forming the first and second external electrodes 131 and 132 will hereinafter be described in detail.

Seed layers were formed on a lower surface of the ceramic body 110 using a conductive paste. A conductive metal in the conductive paste may be the same as that of the internal electrodes, but is not limited thereto. For example, the conductive metal may be copper (Cu), nickel (Ni), palladium (Pd), platinum (Pt), gold (Au), silver (Ag), lead (Pb), or alloys thereof.

The seed layers may be formed, for example, by a screen printing method, a gravure printing method, or the like. However, the method of forming the seed layers is not limited thereto, and may also be a sputtering method or a depositing method, for example.

The first and second electrode layers 131a and 132a were formed on respective end surfaces of the ceramic body 110 in the length direction, so as to contact and be electrically connected to the first and second internal electrodes 121 and 122, respectively. The first and second electrode layers 131a and 132a may be formed of the same conductive metal as that of the internal electrodes, but are not limited thereto. For example, the first and second electrode layers 131a and 132a may be formed of copper (Cu), silver (Ag), nickel (Ni), or alloys thereof.

The first and second electrode layers 131a and 132a may be formed on by the sheet transfer method or the pad transfer method, as opposed to the dipping method mainly used in the related art.

Sheets or pads for forming first and second electrode layers can be positioned on a pressing rubber on a surface plate. The ceramic body can be closely adhered to the sheets or the pads while pressure is applied to the sheets or the pads to thereby attach the sheets or pads to the ceramic body.

Heat can be applied to the surface plate to increase ductility of the sheets, thereby increasing adhesion between the ceramic body and the sheets, while attaching the sheets onto the ceramic body so as to extend on the lower surface of the ceramic body on which the seed layers are formed.

The ceramic body onto which the sheets are attached can be pressed onto a punching rubber on the surface plate to remove unnecessary portions of the sheets attached to the ceramic body.

As another method, sheets for forming first and second electrode layers with polyethylene terephthalate (PET) films attached can be positioned on a pressing rubber on a surface plate, and the ceramic body 110 can be closely adhered to the sheets while applying pressure to the sheets, thereby attaching the sheets to form the first and second electrode layers on the ceramic body.

The sheets can be cut in corner portions of the ceramic body 110 by the PET films, and left only on the end surfaces of the ceramic body when the pressure is removed.

Portions of the sheets that are not attached onto the ceramic body remain on the PET films, such that a separate process of removing unnecessary sheets may be omitted.

According to the method described above, the first and second electrode layers may be formed on the end surfaces, corresponding to both end surfaces of the ceramic body in the length direction of the ceramic body, and may be connected to the seed layers formed on the lower surface of the ceramic body, such that thicknesses of the external electrodes may be further reduced, whereby a high capacitance multilayer ceramic capacitor may be implemented.

The insulating layers 131b and 132b can be formed on the first and second electrode layers 131a and 132a, respectively, using an epoxy resist or the like.

The insulating layers 131b and 132b may be formed down to a region horizontally corresponding to the lower cover part 113, preferably horizontally corresponding to the upper third portion of the lower cover part 113.

The epoxy resist may be applied by dipping or by various printing methods, but the epoxy resist according to the present disclosure is not limited thereto. After the epoxy resist is applied, a heat treatment process may be performed on the epoxy resist to harden the applied epoxy resist.

After the insulating layers 131b and 132b are formed, the first and second plating layers 131c and 132c can be formed on a region extending from the lower surface of the ceramic body to the end portions of the insulating layers 131b and 132b by performing plating by a method such as electroplating or the like.

A material used for the plating may be nickel, tin, a nickel-tin alloy, or the like, but is not limited thereto.

The first and second plating layers 131c and 132c may be formed by sequentially applying a nickel plating layer and a tin plating layer to the region from the lower surface of the ceramic body to the end portions of the insulating layers 131b and 132b.

The multilayer ceramic capacitors were manufactured by the manufacturing method described above. The manufacturing tolerance was in a range of ±0.1 mm in length×width (L×W). When the manufactured multilayer ceramic capacitors satisfied the manufacturing tolerance, experiments were performed on the manufactured multilayer ceramic capacitors to measure acoustic noise of the manufactured multilayer ceramic capacitors.

The data in Table 1 was obtained by measuring the dimensions of each capacitor from an image captured by a scanning electron microscope (SEM) of a cross-section of each capacitor cut in a length-thickness direction (L-T) in a central portion of the ceramic body 110 in the width direction, as illustrated in FIG. 4.

As described above, "A" refers to one-half of the thickness of the ceramic body 110, "B" refers to the thickness of the lower cover part 113, "C" refers to one-half of the thickness of the active part 115, and "D" refers to the thickness of the upper cover part 112.

In order to measure acoustic noise, one sample (a multilayer ceramic capacitor) for each acoustic noise measuring board was mounted on a printed circuit board, while upper and lower portions of the sample were distinguished from each other, and the board was mounted on a measuring jig.

Direct current (DC) voltages and voltage variations were applied to both terminals of the sample mounted on the measuring jig by a DC power supply and a function generator. Acoustic noise was measured through a microphone installed immediately above the printed circuit board.

In Table 1, Samples 1 to 3 are Comparative Examples having a cover symmetry structure in which the thickness B of the lower cover part 113 and the thickness D of the upper cover part 112 are substantially similar to each other. Samples. 4 to 14 are Comparative Examples having a structure in which the thickness D of the upper cover part 112 is greater than the thickness B of the lower cover part 113.

TABLE 1

| Sample No. | A | B | C | D | (B + C)/A | B/A | D/B | C/B | Acoustic Noise (dB) | Capacitance Implementation Ratio |
|---|---|---|---|---|---|---|---|---|---|---|
| 1* | 405.3 | 40.3 | 366.5 | 37.4 | 1.003 | 0.099 | 0.930 | 9.103 | 28.4 | OK |
| 2* | 432.0 | 69.0 | 361.9 | 70.2 | 0.998 | 0.160 | 1.017 | 5.245 | 23.2 | OK |
| 3* | 457.1 | 93.1 | 362.1 | 90.8 | 0.996 | 0.204 | 0.975 | 3.888 | 21.5 | OK |
| 4* | 508.8 | 26.2 | 360.9 | 266.9 | 0.761 | 0.051 | 10.208 | 13.799 | 29.8 | OK |
| 5* | 458.0 | 28.8 | 357.4 | 167.9 | 0.843 | 0.063 | 5.822 | 12.393 | 30.5 | OK |
| 6* | 525.6 | 30.6 | 192.4 | 643.5 | 0.424 | 0.058 | 21.017 | 6.285 | 28.5 | OK |
| 7* | 412.3 | 35.2 | 188.1 | 419.2 | 0.541 | 0.085 | 11.923 | 5.348 | 29.5 | OK |
| 8* | 514.5 | 36.3 | 359.6 | 268.5 | 0.770 | 0.071 | 7.390 | 9.896 | 26.5 | OK |
| 9* | 444.5 | 42.7 | 362.7 | 121.2 | 0.912 | 0.096 | 2.839 | 8.495 | 28.1 | OK |
| 10* | 468.0 | 41.1 | 363.4 | 167.8 | 0.864 | 0.088 | 4.080 | 8.839 | 26.5 | OK |
| 11* | 417.2 | 39.4 | 364.9 | 72.8 | 0.969 | 0.094 | 1.846 | 9.260 | 26.1 | OK |
| 12* | 426.8 | 44.0 | 361.5 | 94.6 | 0.950 | 0.103 | 2.151 | 8.220 | 25.9 | OK |
| 13* | 495.3 | 38.5 | 366.0 | 224.2 | 0.817 | 0.078 | 5.831 | 9.518 | 26.1 | OK |
| 14* | 433.7 | 24.7 | 420.9 | 2.4 | 1.028 | 0.057 | 0.098 | 17.053 | 30.1 | OK |
| 15 | 417.0 | 69.3 | 368.7 | 37.7 | 1.050 | 0.166 | 0.545 | 5.319 | 23.1 | OK |
| 16 | 432.5 | 95.6 | 365.1 | 39.1 | 1.065 | 0.221 | 0.409 | 3.819 | 18.1 | OK |
| 17 | 442.0 | 106.6 | 391.9 | 5.4 | 1.128 | 0.241 | 0.051 | 3.675 | 19.0 | OK |
| 18 | 443.1 | 118.3 | 363.0 | 42.0 | 1.086 | 0.267 | 0.355 | 3.069 | 18.1 | OK |
| 19 | 445.6 | 147.6 | 360.2 | 18.2 | 1.139 | 0.331 | 0.124 | 2.441 | 17.3 | OK |
| 20 | 453.5 | 164.3 | 354.2 | 21.1 | 1.143 | 0.362 | 0.128 | 2.156 | 17.0 | OK |
| 21 | 447.2 | 172.4 | 361.6 | 5.0 | 1.194 | 0.385 | 0.029 | 2.098 | 16.9 | OK |
| 22 | 472.7 | 175.8 | 362.7 | 40.2 | 1.139 | 0.372 | 0.229 | 2.064 | 16.8 | OK |
| 23 | 493.1 | 216.8 | 361.0 | 41.8 | 1.172 | 0.440 | 0.193 | 1.665 | 16.8 | OK |
| 24 | 501.8 | 270.4 | 357.5 | 12.1 | 1.251 | 0.539 | 0.045 | 1.322 | 16.7 | OK |
| 25 | 517.1 | 269.8 | 363.3 | 40.2 | 1.224 | 0.522 | 0.149 | 1.346 | 16.6 | OK |
| 26 | 500.9 | 366.8 | 314.1 | 16.0 | 1.359 | 0.732 | 0.044 | 0.856 | 16.6 | OK |
| 27 | 406.4 | 423.2 | 190.6 | 15.7 | 1.510 | 1.041 | 0.037 | 0.450 | 16.5 | OK |
| 28 | 446.2 | 494.7 | 177.6 | 40.0 | 1.507 | 1.109 | 0.081 | 0.359 | 16.4 | OK |
| 29 | 485.2 | 632.9 | 156.0 | 13.3 | 1.626 | 1.304 | 0.021 | 0.247 | 16.4 | OK |
| 30 | 522.7 | 645.0 | 189.0 | 15.6 | 1.596 | 1.234 | 0.024 | 0.293 | 16.4 | OK |
| 31 | 488.3 | 688.2 | 122.4 | 46.8 | 1.660 | 1.409 | 0.068 | 0.178 | 16.3 | OK |
| 32 | 507.8 | 742.1 | 119.9 | 29.5 | 1.698 | 1.461 | 0.040 | 0.162 | 16.3 | OK |
| 33 | 513.8 | 776.0 | 115.7 | 20.2 | 1.735 | 1.510 | 0.026 | 0.149 | 16.3 | OK |
| 34 | 522.5 | 803.0 | 118.7 | 18.1 | 1.764 | 1.537 | 0.023 | 0.148 | 16.3 | OK |
| 35* | 531.6 | 828.8 | 107.5 | 12.1 | 1.761 | 1.559 | 0.015 | 0.130 | 16.3 | NG |
| 36* | 533.8 | 843.1 | 106.3 | 13.3 | 1.778 | 1.579 | 0.016 | 0.126 | 16.3 | NG |
| 37* | 534.6 | 850.0 | 100.7 | 17.3 | 1.778 | 1.590 | 0.020 | 0.118 | 16.3 | NG |

Here, "*" indicates a Comparative Example.

Samples 14 and 35 to 37 are Comparative Examples having a structure in which the thickness B of the lower cover part 113 is greater than the thickness D of the upper cover part 112. Sample Nos. 15 to 34 are Inventive Examples.

Where the relationship (B+C)/A is substantially equal to 1, it means that the central portion of the active part 115 in the thickness direction is not significantly distant from the central portion of the ceramic body 110 in the thickness direction. Values of (B+C)/A in Samples 1 to 3, where the thickness B of the lower cover part 113 and the thickness D of the upper cover part 112 are substantially similar to each other were substantially equal to 1.

When the value of (B+C)/A is greater than 1, it means that the central portion of the active part 115 is above the central portion of the ceramic body 110. When the value of (B+C)/A is smaller than 1, it means that the central portion of the active part 115 is below the central portion of the ceramic body 110.

It may be appreciated from Table 1 that acoustic noise was significantly reduced (to less than 25 dB) in Sample Nos. 15 to 34, which are Inventive Examples where the relationship 1.050≤(B+C)/A≤1.764 is satisfied.

In contrast, in Samples 1 to 14, where the value of (B+C)/A is less than 1.050, acoustic noise was 21 to 31 dB, and higher than in the Inventive Examples.

Samples 35 to 37, where the value of (B+C)/A exceeds 1.761, had measured capacitance values lower than target capacitance values, and were thus designated as having a capacitance defect.

In Table 1, samples with a capacitance implementation ratio (that is, a ratio of measured capacitance to target capacitance) denoted as "NG" mean that the ratio of measured capacitance to target capacitance is less than 80%.

In Inventive Examples satisfying the relationship 0.021≤D/B≤0.545, in which D/B is a ratio of the thickness of the upper cover part 112, D, to the thickness of the lower cover part 113, B, acoustic noise was significantly reduced.

On the other hand, in Comparative Examples where the ratio D/B exceeded 0.545, the acoustic noise was not significantly reduced.

Where D/B is less than 0.021, the thickness B of the lower cover part 113 is excessively larger than the thickness D of the upper cover part 112, which can cause a crack or delamination and lower the capacitance below the target capacitance.

In Samples 19 to 34, which are Inventive Examples where the relationships 0.331≤B/A≤1.537 and 0.148≤C/B≤2.441 were both satisfied, acoustic noise was further reduced (less than 18 dB).

On the other hand, in Samples 35 to 37, where B/A exceeded 1.537, or where C/B was less than 0.148, the measured capacitance was lower than the target capacitance.

Board Having Multilayer Ceramic Capacitor

Figure 5:
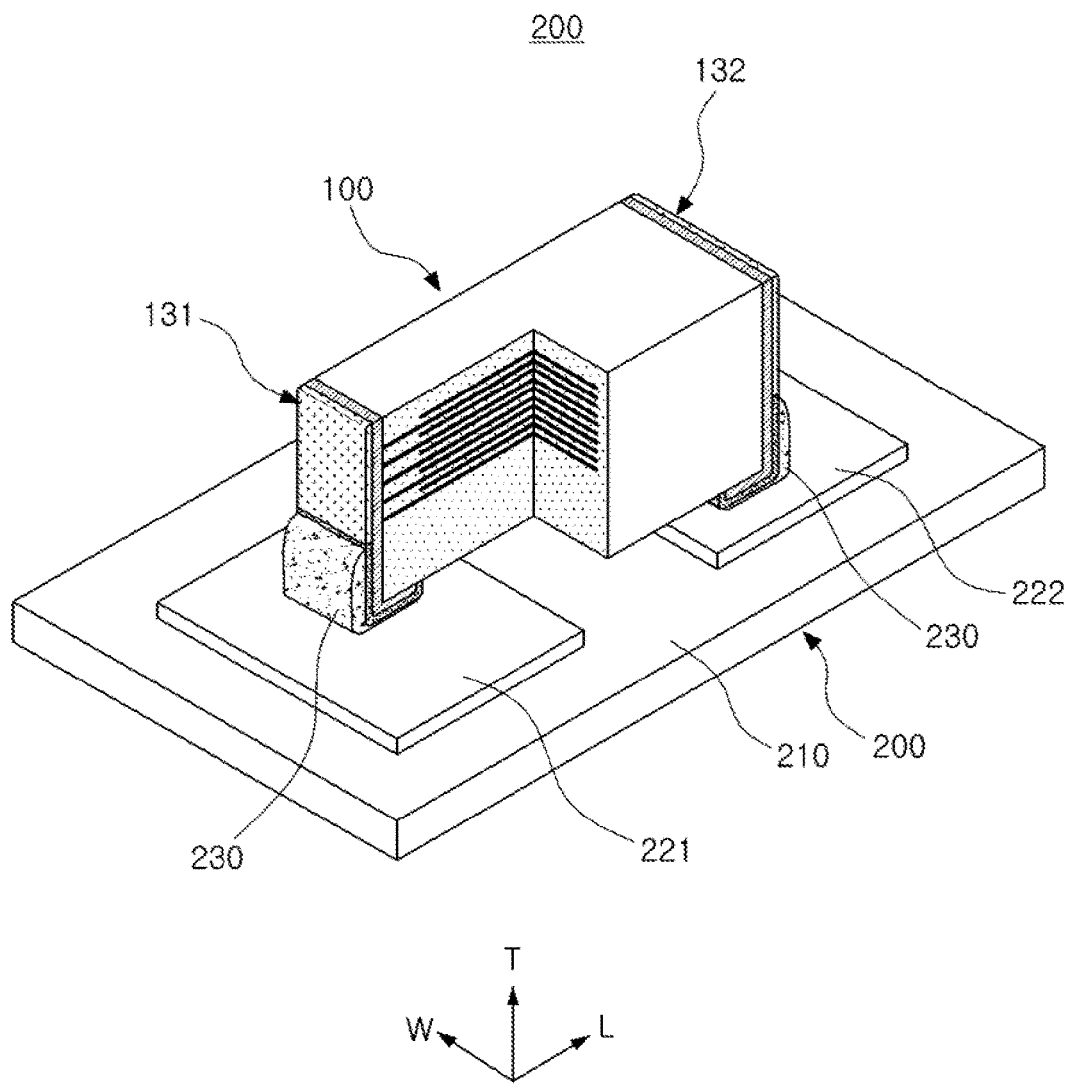
FIG. 5 is a perspective view schematically illustrating a form in which the multilayer ceramic capacitor of FIG. 1 is mounted on a printed circuit board in a state in which the multilayer ceramic capacitor and solder is partially cut-away.
Figure 6:
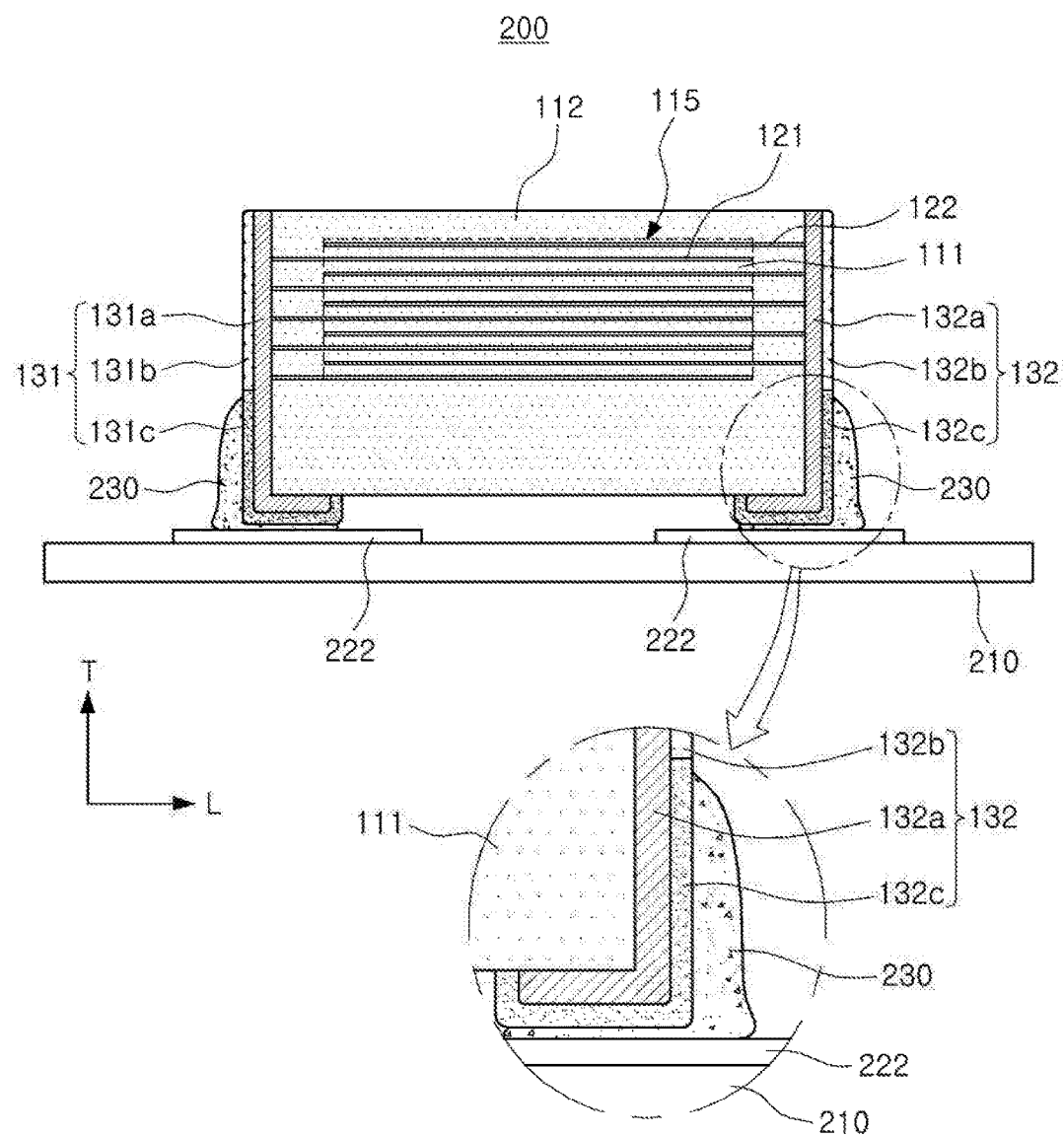
FIG. 6 is a cross-sectional view of the multilayer ceramic capacitor and the printed circuit board of FIG. 5 cut in a length direction.

FIG. 5 is a perspective view schematically illustrating a form in which the multilayer ceramic capacitor of FIG. 1 is mounted on a printed circuit board in a state in which the multilayer ceramic capacitor is partially cut away, and FIG. 6 is a cross-sectional view of the multilayer ceramic capacitor and the printed circuit board of FIG. 5 cut in a length direction.

Referring to FIGS. 5 and 6, a board 200 having a multilayer ceramic capacitor 100 according to the present exemplary embodiment may include a printed circuit board 210 on which the multilayer ceramic capacitor 100 is mounted and first and second electrode pads 221 and 222 formed on an upper surface of the printed circuit board 210 so as to be spaced apart from each other.

The multilayer ceramic capacitor 100 may be mounted on the printed circuit board 210 so that the lower surface thereof, on which the first and second electrode layers 131a and 132a are disposed, faces the printed circuit board 210.

The multilayer ceramic capacitor 100 may be electrically connected to the printed circuit board 210 by solder 230, where the lower cover part 113 is disposed in a lower portion, and the first and second plating layers 131c and 132c, formed on the first and second electrode layers 131a and 132a, respectively, are positioned on and in contact with the first and second electrode pads 221 and 222, respectively.

When voltages are applied to the multilayer ceramic capacitor 100 when mounted on the printed circuit board 210 as described above, acoustic noise may be generated.

Sizes of the first and second electrode pads 221 and 222 may become indices in determining the amount of solder 230 needed to connect the first and second external electrodes 131 and 132 of the multilayer ceramic capacitor 100 to the respective first and second electrode pads 221 and 222. The magnitude of the acoustic noise may be controlled depending on the amount of solder 230.

In the present exemplary embodiment, the solder 230 may be formed only up to end portions of the insulating layers on the end surfaces of the ceramic body 110. Therefore, the amount of solder 230 may be reduced, as described above, to reduce the magnitude of acoustic noise.

Figure 7:
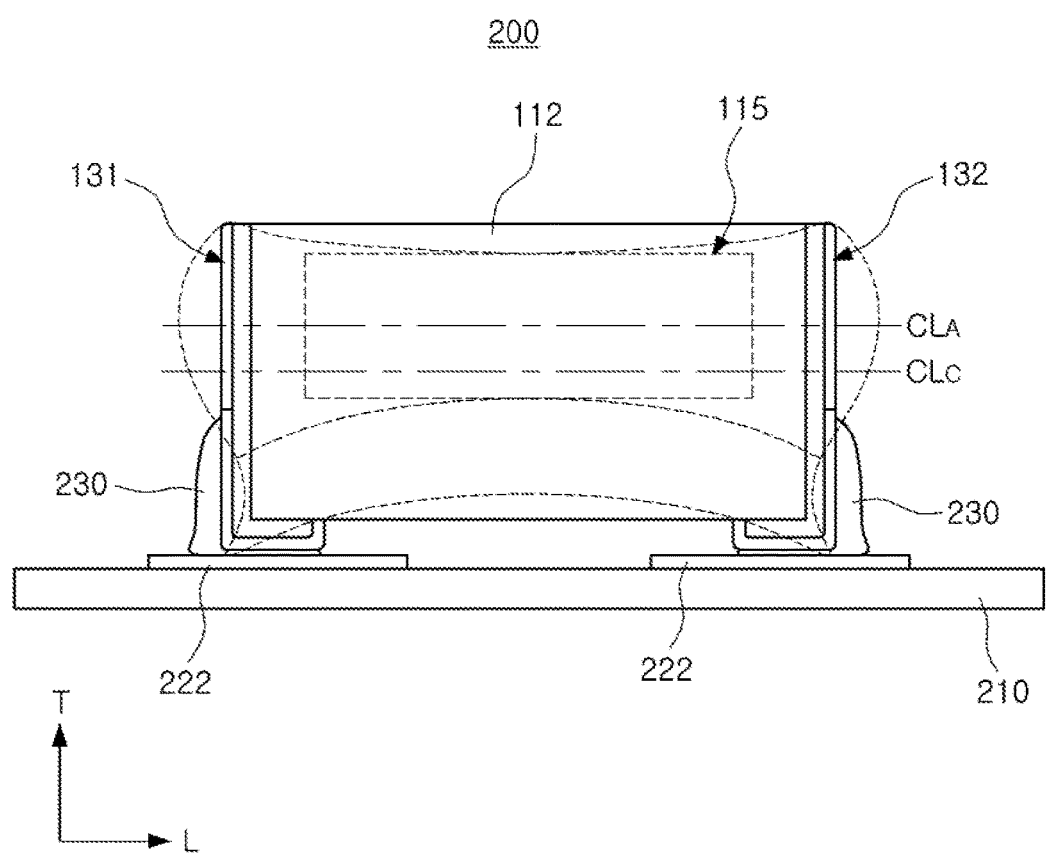
FIG. 7 is a cross-sectional view schematically illustrating a form in which the multilayer ceramic capacitor of FIG. 5 is deformed by voltages applied thereto in a state in which the multilayer ceramic capacitor is printed on the printed circuit board.

FIG. 7 is a cross-sectional view schematically illustrating a form in which the multilayer ceramic capacitor of FIG. 5 is deformed by voltages applied thereto in a state in which the multilayer ceramic capacitor is mounted on the printed circuit board.

Referring to FIG. 7, when voltages having different polarities are respectively applied to the first and second external electrodes 131 and 132 of the multilayer ceramic capacitor 100 when mounted on the printed circuit board 210, the ceramic body 110 may expand and contract in the thickness direction due to an inverse piezoelectric effect of the dielectric layers 111, and both end surfaces of the ceramic body 110 in the length direction, on which the first and second external electrodes 131 and 132 are formed, may contract and expand in opposition to the expansion and the contraction of the ceramic body 110 in the thickness direction, due to a Poisson effect.

The central portion of the active part 115 may be a portion in which large contraction and expansion are generated on both end surfaces of the ceramic body 110 in the length direction, and when the solder 230 is bonded to this portion, most of the contraction and expansion behavior of the two end surfaces of the ceramic body 110 in the length direction of the ceramic body 110 may be transferred to the printed circuit board 210 through the solder 230, which generates a large amount of acoustic noise.

According to the present exemplary embodiment, the mounted surfaces of the first and second external electrodes 131 and 132 may be formed on a position at which displacement of the ceramic body 110 is small and vibrations are not transferred easily, that is, on the lower surface.

Therefore, inflection points, formed on both end surfaces of the ceramic body 110 in the length direction due to a difference between a deformation rate generated in the central portion $CL_A$ of the active part 115 and a deformation rate generated in the lower cover part 113 by the voltages applied to the external electrodes, may be formed at a level equal to or lower than a height of the solder 230, to reduce acoustic noise.

The first and second external electrodes 131 and 132 may be not formed on the two side surfaces of the ceramic body 110 in the width direction of the ceramic body 110, and the solder 230 may be not formed by the insulating layers 131b and 132b in predetermined regions of the two end surfaces of the ceramic body 110 in the length direction, that is, in regions from the upper corner portions of the ceramic body 110 to the region horizontally corresponding to the lower cover part 113, preferably horizontally corresponding to the upper third portion of the lower cover part 113, such that the height of the solder 230 may be significantly lowered.

The amount of solder 230 formed on circumferential surfaces of the first and second external electrodes 131 and 132 may be reduced to thereby reduce the acoustic noise transferred through the first and second external electrodes 131 and 132 and the solder 230. Even where a plurality of multilayer ceramic capacitors 100 are mounted on the printed circuit board 210 at a high density, solder bridges may be omitted between the respective multilayer ceramic capacitors 100, such that reliability of components may be improved.

As disclosed above, according to the exemplary embodiment in the present disclosure, the external electrodes may have an L shape, such that a separate mark for distinguishing the upper and lower surfaces from each other is not required. Therefore, deterioration of reliability such as a crack, or the like, that may occur from a method for making colors of the upper and lower surfaces of the ceramic body different from each other, which is used to create the separate mark, may be prevented.

According to the exemplary embodiment in the present disclosure, since the external electrodes are only formed on the end surfaces of the ceramic body in the length direction and on the lower surface in the thickness direction, corresponding to the mounting surface, while having the L shape, a structure in which solder 230 goes up along only one surface of the ceramic body may be implemented to reduce acoustic noise.

According to the exemplary embodiment in the present disclosure, the lower cover part has a thickness greater than that of the upper cover part and the insulating layers are formed on the external electrodes disposed on the end surfaces of the ceramic body in the length direction of the ceramic body and are formed down to a region horizontally corresponding to the lower cover part, preferably horizontally corresponding to the upper third portion of the lower cover part, to lower a height of the solder 230 formed on the external electrodes and thus suppress vibrations generated in the multilayer ceramic electronic component from being transferred to the printed circuit board through the external electrodes and the solder, thereby reducing acoustic noise.

While exemplary embodiments have been shown and described above, it will be apparent to those skilled in the art that modifications and variations could be made without departing from the scope of the present invention, as defined by the appended claims.

What is claimed is:

1. A multilayer ceramic electronic component comprising:
a ceramic body including:
an active part including a plurality of first and second internal electrodes disposed in the ceramic body to be alternately exposed to respective end surfaces of the ceramic body, with dielectric layers interposed therebetween;
an upper cover part formed above the active part; and
a lower cover part formed below the active part and having a thickness greater than that of the upper cover part;
first and second external electrodes electrically connected to the first and second internal electrodes, respectively, on respective end surfaces of the ceramic body in a length direction, on a lower surface of the ceramic body in a thickness direction, and are not on an upper surface of the ceramic body in the thickness direction;
first and second insulating layers on respective end surfaces of the first and second external electrodes in the length direction, extending from respective positions horizontally corresponding to upper corner portions of the ceramic body in a thickness direction down to a level in the thickness direction horizontally corresponding to upper third portion of the lower cover part; and
first and second plating layers on respective end surfaces of the first and second external electrodes in the length direction, respectively extending up to the level down to which the first and second insulating layers extend, and respectively below, in the thickness direction, the first and second insulating layers.

2. The multilayer ceramic electronic component of claim 1, wherein the first and second external electrodes are disposed on respective end surfaces of the ceramic body in the length direction of the ceramic body up to corresponding corner portions of the ceramic body.

3. The multilayer ceramic electronic component of claim 1, wherein the first and second external electrodes extend on the two side surfaces of the ceramic body in a width direction.

4. The multilayer ceramic electronic component of claim 1, wherein $1.050 \leq (B+C)/A \leq 1.764$ in which A is one-half of a thickness of the ceramic body, B is a thickness of the lower cover part, C is one-half of a thickness of the active part, whereby a central portion in the thickness direction of the active part is above a central portion in the thickness direction of the ceramic body.

5. The multilayer ceramic electronic component of claim 1, wherein $0.021 \leq D/B \leq 0.545$ in which D is a thickness of the upper cover part and B is a thickness of the lower cover part.

6. The multilayer ceramic electronic component of claim 1, wherein $0.331 \leq B/A \leq 1.537$ in which B is a thickness of the lower cover part and A is one-half of a thickness of the ceramic body.

7. The multilayer ceramic electronic component of claim 1, wherein $0.148 \leq C/B \leq 2.441$ in which C is one-half of a thickness of the active part and B is a thickness of the lower cover part.

8. The multilayer ceramic electronic component of claim 1, wherein each of the first and second external electrodes satisfy the relationship $0.8 \leq T2/T1 \leq 1.2$, in which T1 is a thickness, in the length direction, of the external electrode in a central region of the ceramic body in a thickness direction, and T2 is a thickness of the external electrode at a point horizontally corresponding to an uppermost internal electrode in the thickness direction.

9. A board having a multilayer ceramic electronic component, comprising:
a printed circuit board having electrode pads disposed thereon;
the multilayer ceramic electronic component of claim 1 on the electrode pads; and
solder connecting the electrode pads to the multilayer ceramic electronic component,
wherein the solder is disposed on a lower surface of the ceramic body in the thickness direction and on end surfaces of the ceramic body in the length direction.

10. The board having a multilayer ceramic electronic component of claim 9, wherein the solder is disposed only below the first and second insulating layers in the thickness direction.

11. The board having a multilayer ceramic electronic component of claim 9, wherein each of the first and second external electrodes satisfies the relationship $0.8 \leq T2/T1 \leq 1.2$, in which T1 is a thickness, in the length direction, of the external electrode in a central region of the ceramic body in a thickness direction, and T2 is a thickness of the external electrode, in a length direction, at a point horizontally corresponding to an uppermost internal electrode in the thickness direction.

* * * * *